(12) United States Patent
Göbl et al.

(10) Patent No.: US 6,654,249 B2
(45) Date of Patent: Nov. 25, 2003

(54) CIRCUIT ARRANGEMENT

(75) Inventors: Christian Göbl, Nürnberg (DE);
Werner Trusky, Schwabach (DE);
Jürgen Steger, Hilpotstein (DE); Peter Beckedahl, Nashua, NH (US); Paul Mourick, Fürth (DE)

(73) Assignee: Semikron Elektronix GmbH, Nuremburg (DE)

( * ) Notice: Subject to any disclaimer, the term of this patent is extended or adjusted under 35 U.S.C. 154(b) by 0 days.

(21) Appl. No.: 10/138,023

(22) Filed: May 2, 2002

(65) Prior Publication Data

US 2002/0186543 A1 Dec. 12, 2002

(30) Foreign Application Priority Data

Jun. 8, 2001 (DE) .......................................... 101 27 947
Aug. 22, 2001 (DE) .......................................... 101 41 114

(51) Int. Cl.[7] ................................................ H05K 7/20
(52) U.S. Cl. ....................... 361/707; 165/80.2; 165/185;
165/80.3; 174/16.3; 257/712; 257/691;
257/693; 257/698; 257/696; 257/728; 361/710;
361/715; 363/141; 363/147
(58) Field of Search ............................... 165/80.2, 80.3,
165/185; 174/16.3, 260; 257/706–707, 712–713,
686–698, 718–719, 726–728; 361/690,
704–710, 715, 719–721; 363/141, 144

(56) References Cited

U.S. PATENT DOCUMENTS 4,458,305 A * 7/1984 Buckle et al. .............. 363/141
4,965,710 A * 10/1990 Pelly et al. ................. 361/707
5,457,604 A * 10/1995 Ando ......................... 361/707
5,471,089 A * 11/1995 Nagatomo et al. ......... 257/691
5,966,291 A * 10/1999 Baumel et al. ............. 361/707
6,078,501 A * 6/2000 Catrambone et al. ...... 361/704
6,249,024 B1 * 6/2001 Mangtani ................... 257/698
6,359,331 B1 * 3/2002 Rinehart et al. ........... 257/691
6,381,161 B2   4/2002 Mourick .................... 363/147
6,441,520 B1 * 8/2002 Grant ........................ 361/715
6,501,662 B2 * 12/2002 Ikeda ........................ 361/707

FOREIGN PATENT DOCUMENTS

DE          100 37 533       7/2000

* cited by examiner

Primary Examiner—Gergory Thompson
(74) Attorney, Agent, or Firm—Darby & Darby (57) ABSTRACT

A circuit arrangement includes a base body, with one or more substrates, an intermediate-circuit board, a compression device and a driver circuit. Each substrate includes a positive-pole conductive strip, a negative-pole conductive strip, and auxiliary connections. Components such as power transistors, are in contact with the conductive strips and the auxiliary connections. The intermediate-circuit board includes a positive-pole DC connection and negative-pole DC connection and electrical capacitors connected between them. An AC connection element that must be cooled is assigned to each substrate. The positive-pole DC connection and the negative-pole DC connection include contacts for direct low-inductance connection with the corresponding conductive strips of the one or more substrates. The equivalent applies to the one or more AC connection elements. The compression device electrically connects the contacts of the positive-pole and negative-pole DC connections and the contacts of the one or more AC connection elements.

16 Claims, 7 Drawing Sheets

CIRCUIT ARRANGEMENT

BACKGROUND

The present invention relates to a circuit arrangement with a base body. One or more substrates are provided on the top surface of the base body with a positive-pole conductive strip, a negative-pole conductive strip, and an AC conductive strip as well as auxiliary connections, with components such as transistors, thyristors, diodes, resistors, integrated circuits or sensors, at least some of which are in contact with said conductive strips, with an intermediate-circuit board with a positive-pole DC connection and a negative-pole DC connection, and with one or more electrical capacitors connected between the positive-pole DC connection and the negative-pole DC connection, and with one or more AC connectors.

A circuit arrangement with low parasitic inductances, with an electrically insulating substrate on which mutually electrically insulated metallic conductive strips carrying power switches is disclosed in the earlier patent application 100 37 533.2. In that reference, the power switches include power transistors formed preferably from MOSFETs or IGBTs.

The operation of such a circuit arrangement generates heat in the intermediate circuit, on the substrate and on the AC connection elements. In the prior art, the intermediate circuit is cooled through convection at the components. The heat of the substrate is dissipated through direct contact with a cooling body. The heat of the AC connection elements is also dissipated only through convection. The heat of the AC connection elements increases their ohmic resistance and thus reduces their current-load capacity. Furthermore, the one or more AC connection elements may include other components, such as sensors, whose function is impaired by the heat.

OBJECTS AND SUMMARY OF THE INVENTION

It is the object of the present invention to create a circuit arrangement of the kind named above, with low parasitic inductance, where the complexity of manufacturing and assembly is low, which provides excellent vibration and shock resistance and facilitates the improved dissipation of heat generated in the intermediate circuit and/or the connection elements to a cooling body.

These objects are achieved with a circuit arrangement of the kind named above according to the invention, with one or more of the following arrangements:

The intermediate-circuit board includes contacts for making a low-inductance contact with the positive-pole conductive strip and the negative-pole conductive strip of one or more substrates, whereby a corresponding AC connection element with contacts is assigned to the intermediate-circuit board and the one or more substrates, and a compression device is provided for the electrical connection of the contacts of the intermediate-circuit board and the one or more AC connection elements with the corresponding conductive strips of the one or more substrates.

One or more connection pins for external electrical connection are brought into thermal contact with the cooling body by means of an electrically insulating and thermally conducting body.

The internal connecting tabs of the one or more current connections include sections by which these connecting tabs form a connection with the cooling body via a thermally conducting and electrically insulating body.

The intermediate-circuit board with the one or more capacitors to be cooled includes contacts for the direct connection with the positive-pole conductive strips and the negative-pole conductive strip of the one or more substrates.

The circuit arrangement according to the invention preferably includes three substrates for the three AC phases (U, V, W). Such a circuit arrangement has three AC connections.

Since the circuit arrangement according to the invention is usually a performance class circuit arrangement, it is preferred that the base body is mounted on a cooling body, with the underside of the one or more substrates in thermally conducting contact with the cooling body. For that purpose, the underside of the one or more substrates can have a metal coating by which a large area of the substrate lies on the base body or cooling body. The base body is in the shape of a frame and includes one or more compartments for a corresponding substrate.

A relatively simple circuit arrangement that can be produced at low manufacturing cost results when in accordance with the invention, the intermediate-circuit board has a first metal surface element with the positive-pole DC connection and a second metal surface element with the negative-pole DC connection. The positive-pole and negative-pole DC connections are electrically insulated from each other, whereby the connection elements of the one or more capacitors of the intermediate-circuit board are in contact with the corresponding metal surface element, and the contacts of the intermediate-circuit board are formed in one piece with the corresponding metal surface element of the one or more substrates. Advantageously, the metal surface elements for the positive-pole DC connection and the negative-pole DC connection can be made of a stamped and appropriately bent sheet metal such as copper. This results in a circuit arrangement with an intermediate-circuit board which can be produced simply and cost-effectively, whereby in addition to those advantages, the design is also compact, mechanically robust and of low inductance.

The electrical insulation of the metal surface element of the positive-pole DC connection and the negative-pole DC connection can be accomplished by a simple flat element made of electrically insulating material. For the external electrical connection of the DC and AC connections, connector pins are provided in the base body and holes in the corresponding connection elements.

Another possibility is, for example, to provide an insulating intermediate-circuit board whose one main surface has a metal coating connected to the positive-pole DC connection and whose opposite second main surface has a metal coating connected to the negative-pole DC connection. The contacts of the intermediate-circuit board have contact fingers for properly contacting the intermediate-circuit board.

Correspondingly, the one or more AC connections can have contacts which also have contact fingers for properly contacting the contacts of the one or more AC connection elements. However, such a plug-in contact requires a fairly substantial installation effort. For that reason it is preferable to design the contacts of the two DC connections of the intermediate-circuit board in one piece with the corresponding metal surface elements, and also to design the contacts of the one or more AC connection elements in one piece with same.

In the circuit arrangement according to the invention, it has been proven advantageous to make the electrical contact of the connection elements of the intermediate-circuit board and the one or more AC connection element with the corresponding conductive strips of the one or more substrates established by means of a compression device. The compression device includes a rigid compression body and a compression element of limited flexibility whose surface dimensions are adapted to the compression body. It is practical to place between the rigid compression body, which is preferably made of metal, and the compression element of limited flexibility, an intermediate body of electrically insulating material which has pipe-like throughelements extending through the rigid compression body. A driver circuit can be arranged on the compression device of the circuit arrangement according to the invention, whereby contact wires, extending through the compression device, are pressure-contacted with the corresponding conductive strips and auxiliary connections of the one or more substrates.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
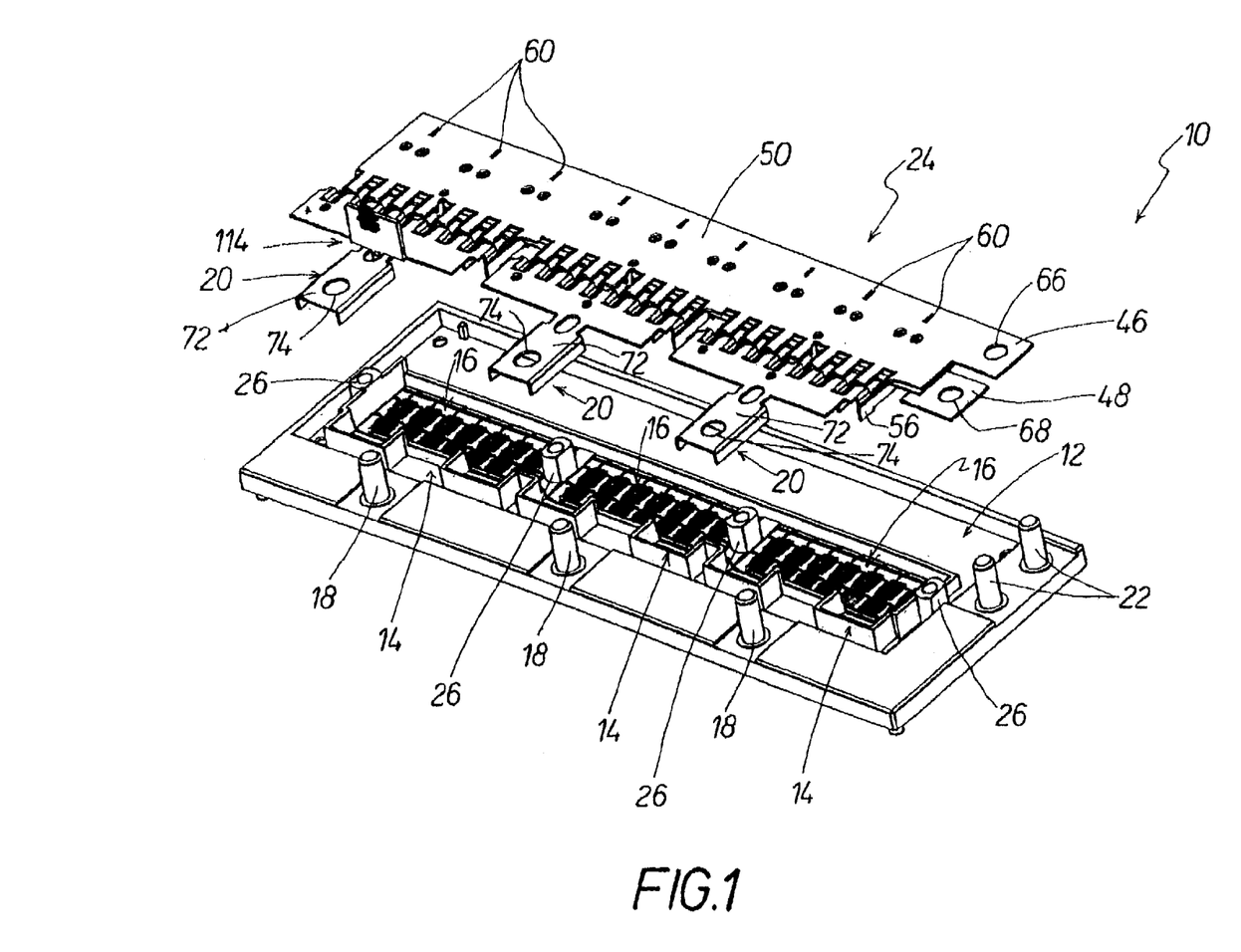
FIG. 1 shows a three-dimensional view of substantial parts of the circuit arrangement, where the base body includes three substrates for the three AC phases, and where the intermediate-circuit board is drawn at a distance from the frame-like base body on which the substrates are mounted.
Figure 2:
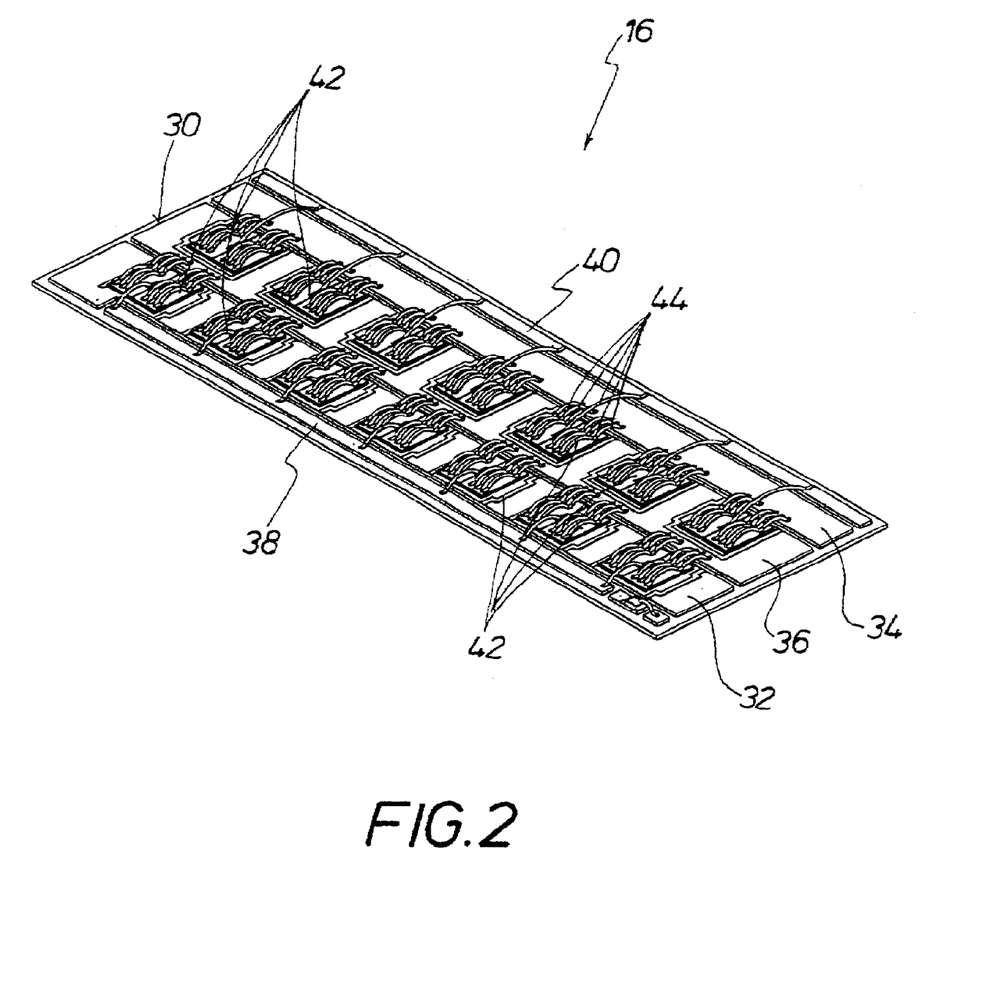
FIG. 2 shows a three-dimensional view of a substrate of the circuit arrangement according to FIG. 1.

Referring now to FIG. 1, circuit arrangement 10, according to the invention, includes a base body 12. The frame-like base body 12 is attached to a cooling body and divided into three separate compartments 14. Each compartment 14 is mounted on its own substrate 16. One such substrate 16 is shown in FIG. 2 and will be described below in more detail.

Figure 4:
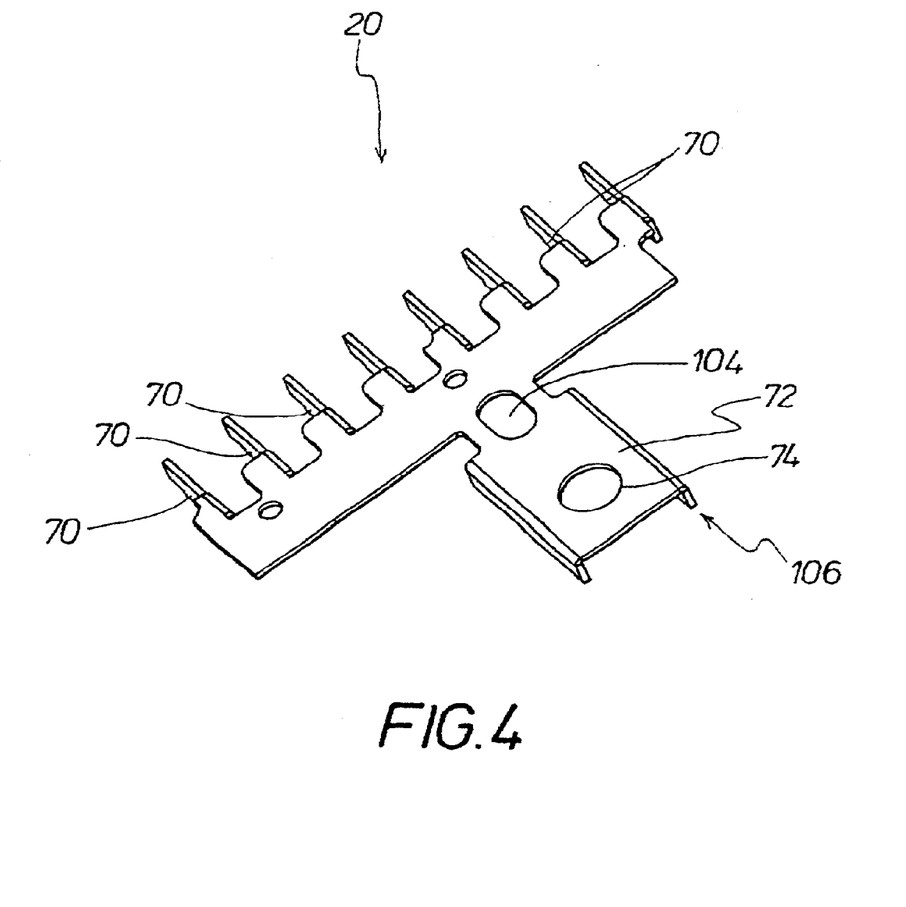
FIG. 4 shows a three-dimensional view of an AC connection element of the circuit arrangement according to FIG. 1.

Pins 18 extend upward from base body 12. Pins 18 guide exact positioning of corresponding AC connection elements 20. One such AC connection element 20 is shown in FIG. 4 and will be described below in more detail.

Figure 3:
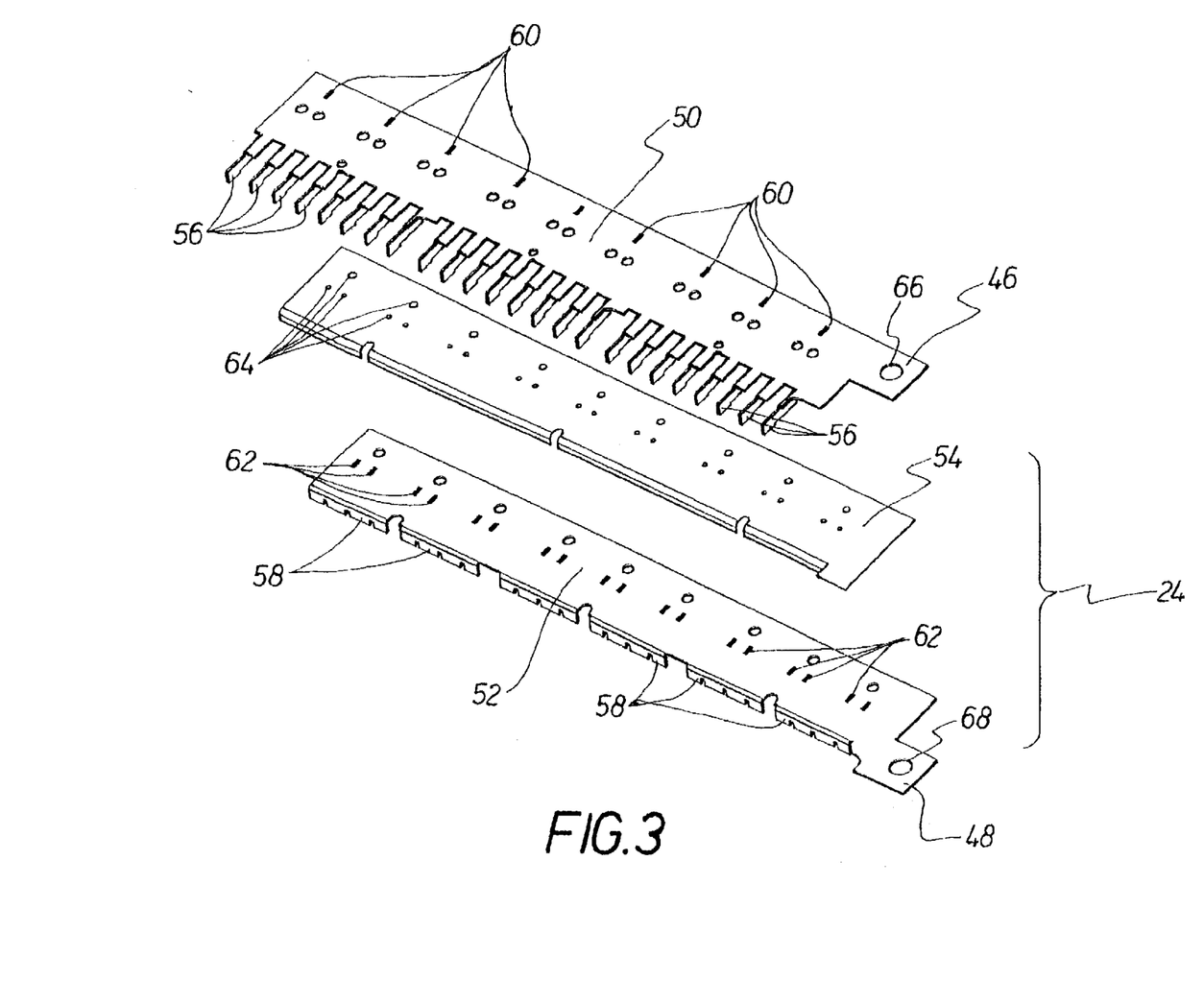
FIG. 3 shows a three-dimensional exploded view of the intermediate-circuit board of the circuit arrangement according to FIG. 1.

Two pins 22 extend upward from one end of base body 12. Pins 22 guide exact positioning of an intermediate-circuit board 24. In FIG. 3, one such intermediate-circuit board 24 is shown in perspective in an exploded view without the associated electrical capacitors. Intermediate circuit board 24 will be described below in more detail.

Also extending upward m base body 12 and formed in one piece with same are threaded sleeves 26. Sleeves 26 serve to fix compression device 28, shown in FIG. 5 in perspective in an exploded view, t base body 12.

On the top surface 30 of each substrate 16 are a positive-pole conductive strip 32 and a negative-pole conductive strip 34. An AC conductive strip 36 is disposed between the positive-pole conductive strip 32 and the negative-pole conductive strip 34. A auxiliary connections 38 and 40 are disposed at the outer edges of substrate 16. Components 42, such as power transistors or power diodes, are in contact with conductive strips 32, 34, 36 and with auxiliary connections 38 and 40. These contacts are established, for example, by bond wires 44.

Referring now also to FIG. 3, a positive-pole DC connection 46 of intermediate-circuit board 24 is in contact with the positive-pole conductive strip 32 of each substrate 16. A negative-pole DC connection 48 of intermediate-circuit board 24 is in contact with the negative-pole conductive strip 34 of each substrate 16. For that purpose, the intermediate-circuit board 24 has a first metal surface element 50 with positive-pole DC connection 46 and a second metal surface element 52 with negative-pole DC connection 48. An insulation element 54 is interposed between first and second metal surface elements 50, 52. The surface of insulation element 54 is adapted to metal surface elements 50 and 52.

The metal surface elements 50 and 52 are made of an electrically conducting stamped sheet metal such as copper. Metal surface elements 50 and 52 are preferably in one piece with projecting contacts 56 for positive-pole DC connection 46. The contacts 56 are aligned perpendicular to the oblong metal surface element 50, with which they form a right angle.

Figure 5:
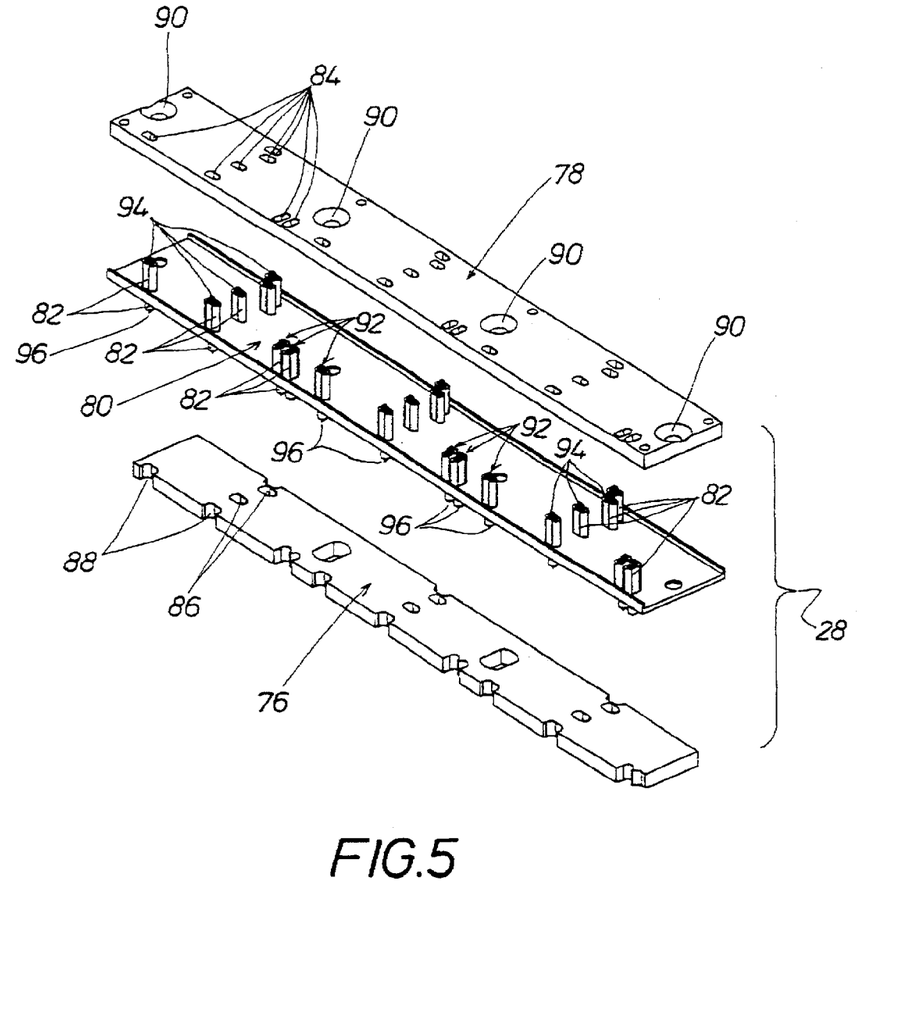
FIG. 5 shows a three-dimensional exploded view of the compression device of the circuit arrangement which is drawn without the compression device in FIG. 1.

Referring now also to FIG. 5, a compression device 28 presses contacts 56 against the positive-pole conductive strip 32 of each substrate 16.

Contacts 58 project vertically in the longitudinal direction from metal surface element 52 of negative-pole DC connection 48. Compression device 28 presses contacts 58 against the negative-pole conductive strip 34 of each substrate 16.

First metal surface element 50 of the positive-pole DC connection 46 includes contact holes 60 to establish an electrically conducting contact with the corresponding connection elements of the capacitors (not shown) of intermediate-circuit board 24. Metal surface element 52 of the negative-pole DC connection 48 includes contact holes 62 for the negative-pole connection elements of the capacitors (not shown) on the intermediate-circuit board 24. Insulation element 54 includes through-holes 64 for the connection elements of the capacitors of the intermediate-circuit board 24.

The closely adjacent arrangement of the intermediate-circuit board 24, formed of metal surface elements 50, 52, with the immediately adjacent contacts 56, 58 and insulation element 54, and substrates 16 which are directly on the cooling body, results in very efficient thermal contact between the capacitors arranged on intermediate-circuit board 24 and the cooling body.

Positive-pole DC connection 46 includes a hole 66 which accommodates one of the pins 22 which extends upward from base body 12. Negative-pole DC connection 48 includes a hole 68 which accommodates the other pin 22 of base body 22.

Referring now also to FIG. 4, AC connection element 20 is a stamped sheet metal part with contacts 70, similar to contacts 56 of metal surface element 50. Contacts 70 provide connection to positive-pole DC connection 46. AC connection element 20 includes a connecting tab 72. The connecting tab 72 of each AC connection element 20 includes a hole 74 through which protrudes the corresponding pin 18 of base body 12 in the assembled state. Another hole 104 also penetrates connecting tab 72 to accommodate a current sensor 114 (see also FIG. 1). Contacts 70 of each AC connection element 20 contact the AC conductive strip 36 of each substrate 16. Contacts 56 and 58 of metal surface elements 50 and 52 for the positive-pole DC connection 46 and negative-pole DC connection 48 of intermediate-circuit board 24 serve to establish direct low-inductance contact with the corresponding conductive strips 32 and 34 of each substrate 16 of circuit arrangement 10.

The area of connecting tab 72 around hole 104 for current sensor 114 requires efficient heat dissipation, since on the one hand, an excessively high temperature would adversely affect the function of the heat sensor, and on the other hand, an excessively high temperature of the connecting tab 72 would increase its ohmic resistance and reduce the maximum current flow and thus directly reduce the efficiency of the circuit arrangement.

Referring to FIG. 5, compression device 28 of circuit arrangement 10 includes a compression element 76 of limited flexibility and a rigid compression body 78. An intermediate body 80 of electrically insulating material is disposed between compression element 76 of limited flexibility and the rigid compression element 78, whose base surface is adapted to same. Insulation sleeves 82 extend upward from intermediate body 80. In the assembled state of compression device 28, insulation sleeves 82 extend through corresponding holes 84 of the rigid compression body 78 and into holes 86 and recesses 88 of compression element 76. In this example, the rigid compression body 78 is made of metal with countersunk holes 90 to accommodate countersunk screws (not shown). The countersunk holes 90 are aligned with the threaded sleeves 26 which extend from base body 12 to fix compression device 28 to base body 12 by means of the countersunk screws. Compression device 28 establishes a matching contact between intermediate-circuit 24 and substrates 16.

Contact wire elements 92 extend through insulation sleeves 82 of intermediate body 80 of compression device 28. Contact wire elements 92 protrude slightly from insulation sleeves 82 on the top surface in a contact section 94. Pin-shaped end sections 96 of insulation sleeves 82 protrude from insulation sleeves 82 on the underside. In the assembled state of circuit arrangement 10, the contact sections 94 of the contact wire elements 92 on the top surface contact corresponding contact points of a driver circuit (not shown) positioned on compression device 28. The pin-shaped end section 96 of contact wire elements 92 on the underside are in contact with the corresponding conductive strips and auxiliary connections of each substrate 16.

Figure 6:
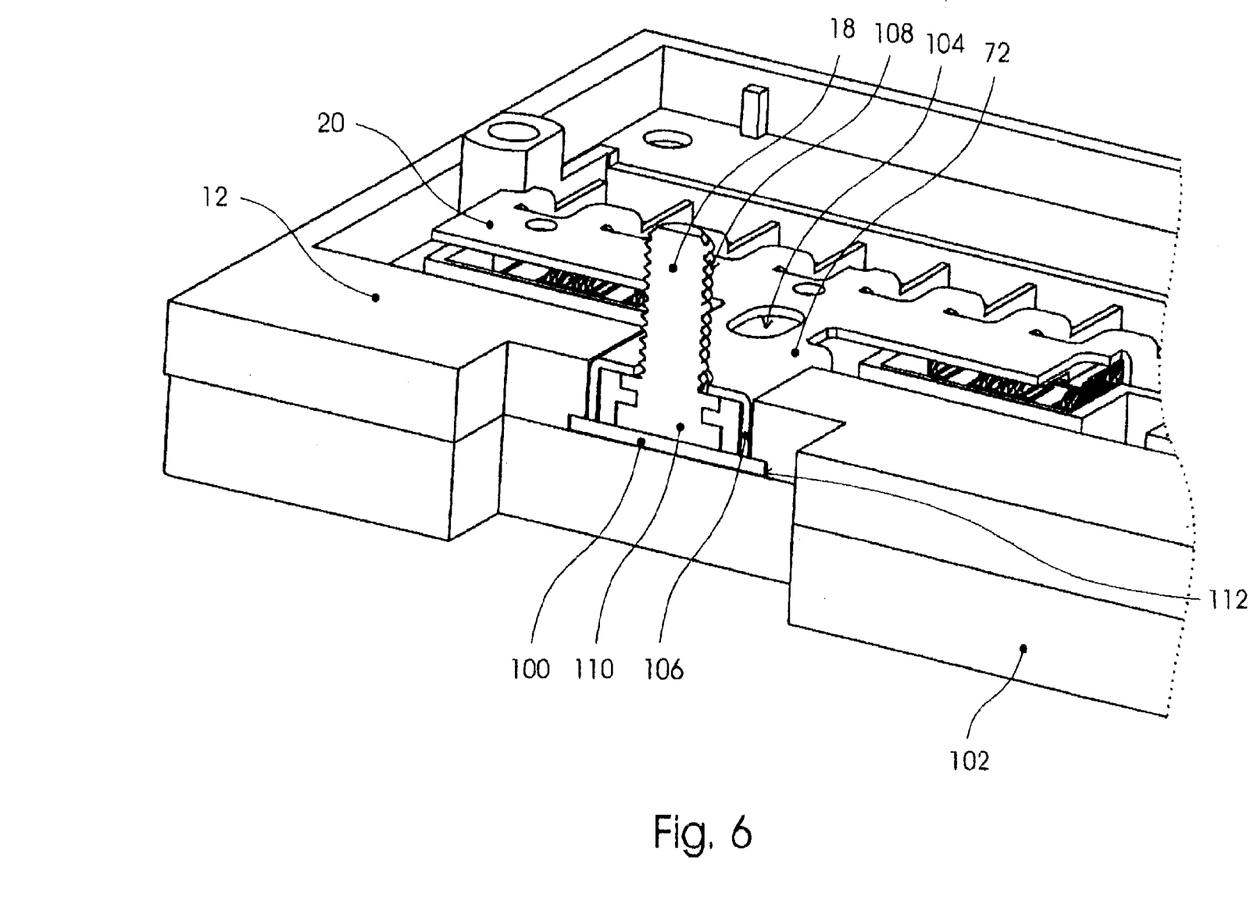
FIG. 6 shows a three-dimensional view of a part of the circuit arrangement with the inventive design of a current connection element and the inventive design of a connecting pin.

FIG. 6 shows details about improving heat dissipation from the area of connecting tab 72. For that purpose, recesses 112 are provided in base body 12 in the area of the connecting tabs 72. These recesses 112 accommodate an electrically insulating body 100 (e.g. mica or aluminum oxide) of low thermal resistance. This helps heat dissipation by two means, both of which are used advantageously, although each alone would lead to a reduction in the temperature of connecting tab 72. The two means include:

On two opposite sides of connecting tab 72, areas 106 are offset in such a way that they are in direct thermal contact with body 100, which in turn is in direct thermal contact with cooling body 102.

Pin 18 consists of a connecting area, preferably with a thread 108, and a foot 110. The foot is in direct thermal contact with electrically insulating body 100 which in turn is in direct thermal contact with cooling body 102. Connecting pin 18 and connecting tab 72 are electro-conductively connected to allow an external AC connection.

Figure 7:
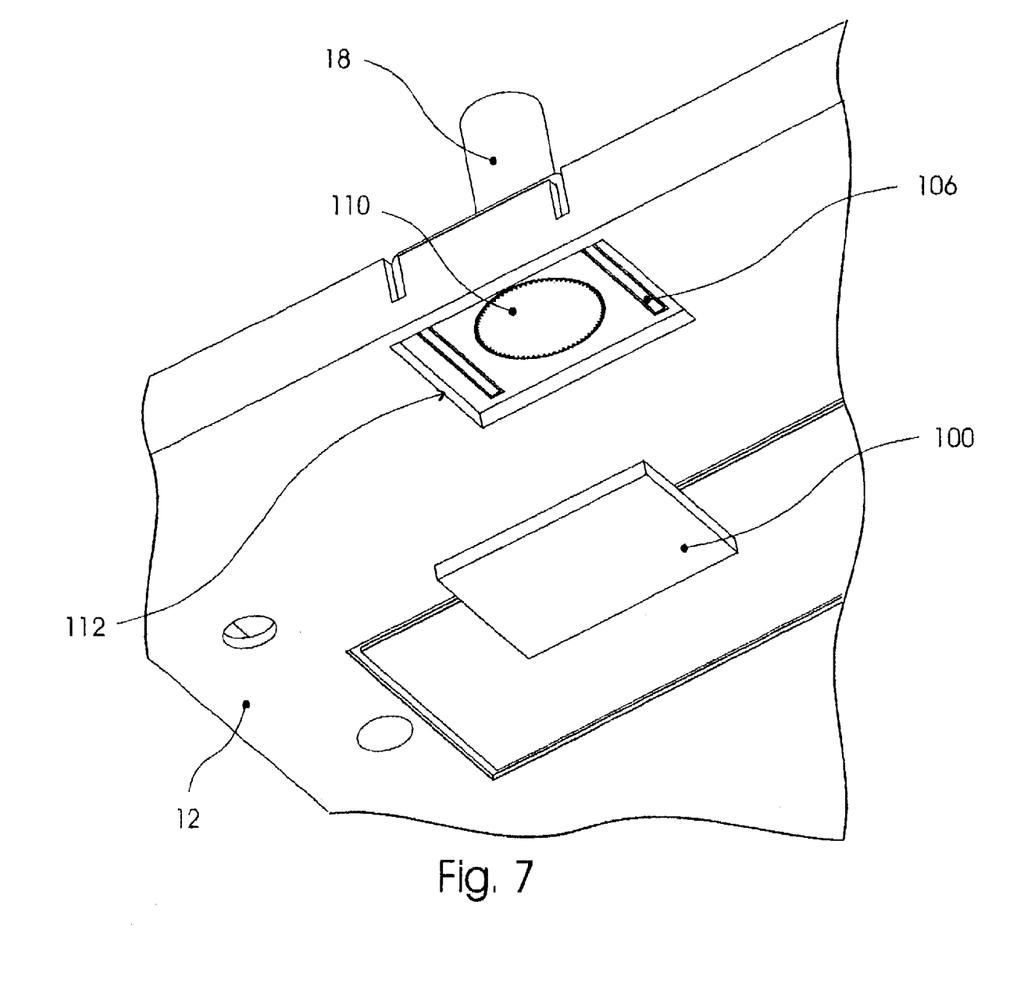
FIG. 7 shows a three-dimensional view of a part of the base body and the inventive design of a connecting pin.

FIG. 7 shows an exploded view of an AC connection seen from the cooling body, which is not shown here. Recess 112 is designed in such a way that a thermally conducting and electrically insulating body 100 forms the thermal contact between foot 110 of connecting pin 18 and the offset sub-areas 106 (see also FIG. 4) of connecting tab 72 on the one hand and cooling body 102 on the other hand.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A circuit arrangement comprising:
   a base body in contact with a first substrate;
   a top surface of said substrate including a positive-pole conductive strip, a negative-pole conductive strip, an AC conductive strip, and auxiliary connections;
   additional components on said top surface being at least partly in contact with said conductive strips and said auxiliary connections;
   an intermediate-circuit board with a positive-pole DC connection and a negative-pole DC connection and at least one electrical capacitor connected between said positive-pole DC connection and said negative-pole DC connection;
   said intermediate-circuit board further comprises:
      at least one AC connection element;
      positive-pole and negative-pole contacts for establishing direct contact of low conductance with respective said positive-pole and negative-pole conductive strips; and
      said AC connection element comprises contacts which contact both said intermediate-circuit board and said first substrate.

2. A circuit arrangement according to claim 1, further comprising:
   said base body attached to a cooling body;
   at least one connecting pin extending from said base body;
   said pin comprising a foot;
   said AC connection element further comprising a connecting tab in contact with said base body;
   an electrically insulating and thermally conducting body in contact with said cooling body; and
   said foot in contact with said electrically insulating and thermally conducting body.

3. A circuit arrangement according to claim 2, wherein said connection tab comprises sub-area; and
   said foot and said sub-areas are in thermal contact with said cooling body via said electrically insulating and thermally conducting body.

4. A circuit arrangement according to claim 1,
further comprising a second and a third substrate; and
said first, second a d third substrates are provided for first, second and third AC phases.

5. A circuit arrangement according to claim 2, wherein:
an underside of said first substrate is in thermally conducting contact with said base body.

6. A circuit arrangement according to claim 1, wherein:
said positive-pole DC connection has a first metal surface element;
said negative-pole DC connection has a second metal surface element; said first and said second metal surfaces are electrically insulated from each other, and disposed on said intermediate-circuit board;
said at least one capacitor comprising connection elements which are in contact wit said metal surface elements ; and
said positive-pole and negative-pole contacts are integrally formed with said respective metal surface element.

7. A circuit arrangement according to claim 1, wherein said contacts of said at least one AC connection element are integrally formed.

8. A circuit arrangement according to claim 1, wherein said additional components include at east one of power diodes, power thyristors, power transistors, sensors, resistors, and integrated circuits.

9. A circuit arrangement according to claim 1, wherein a compression device is included for said electric connection of said contacts with said conductive strips of said at least one substrate.

10. A circuit arrangement according to claim 9, wherein said compression device includes a rigid compression body and a compression element of limited flexibility with surface dimension adapted to said compression body.

11. A circuit arrangement according to claim 9 wherein said compression device includes a driver circuit thereon; and
contact wire elements pass through said compression device and are in pressure contact with said driver circuit a d with said conductive strips of said first at least one substrate.

12. A circuit arrangement according to claim 2, wherein said electrically insulating and thermally conducting body is made of a ceramic material.

13. A circuit arrangement according to claim 2, wherein said connecting pin includes a thread on a part way from said foot.

14. A circuit arrangement according to claim 2, wherein sub-areas of said connecting tab are formed by offset areas of said connecting tab itself.

15. A circuit arrangement according to claim 2, wherein said connecting pin is embedded in said base body and is in thermally and electrically conducting contact with said connecting tab.

16. A circuit arrangement according to claim 6, wherein said substrate, said contacts, and said metal surface elements are arranged closely adjacent to each other to form a short thermally conducting and electrically insulating path between said at least one capacitor and said cooling body for cooling said at least one capacitor.

* * * * *

UNITED STATES PATENT AND TRADEMARK OFFICE
CERTIFICATE OF CORRECTION

PATENT NO.   : 6,654,249 B2
DATED        : November 25, 2003
INVENTOR(S)  : Christian Gobl et al.

It is certified that error appears in the above-identified patent and that said Letters Patent is hereby corrected as shown below:

<u>Title page,</u>
Item [73], Assignee, please delete "Semikron Elektronix GmbH, Nuremberg (DE)" and substitute -- Semikron Elektronik GmbH, Nurnberg (DE) --

Signed and Sealed this

Thirtieth Day of March, 2004

JON W. DUDAS
*Acting Director of the United States Patent and Trademark Office*